(12) United States Patent
Weidman et al.

(10) Patent No.: US 9,236,467 B2
(45) Date of Patent: Jan. 12, 2016

(54) ATOMIC LAYER DEPOSITION OF HAFNIUM OR ZIRCONIUM ALLOY FILMS

(71) Applicant: Applied Materials, Inc., Santa Clara, CA (US)

(72) Inventors: Timothy W. Weidman, Sunnyvale, CA (US); Timothy Michaelson, Milpitas, CA (US); Paul F. Ma, Santa Clara, CA (US); Paul Deaton, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/183,826

(22) Filed: Feb. 19, 2014

(65) Prior Publication Data
US 2014/0231930 A1 Aug. 21, 2014

Related U.S. Application Data

(60) Provisional application No. 61/766,430, filed on Feb. 19, 2013.

(51) Int. Cl.
| | |
|---|---|
| *H01L 29/78* | (2006.01) |
| *C23C 16/18* | (2006.01) |
| *C23C 16/455* | (2006.01) |
| *H01L 21/28* | (2006.01) |
| *H01L 29/49* | (2006.01) |
| *H01L 21/285* | (2006.01) |
| *H01L 21/768* | (2006.01) |

(52) U.S. Cl.
CPC ............... *H01L 29/78* (2013.01); *C23C 16/18* (2013.01); *C23C 16/45553* (2013.01); *H01L 21/28088* (2013.01); *H01L 21/28562* (2013.01); *H01L 21/76841* (2013.01); *H01L 21/76871* (2013.01); *H01L 29/4966* (2013.01)

(58) Field of Classification Search
CPC .............. H01L 21/02107; H01L 29/78; H01L 21/28088; H01L 29/4966; H01L 21/76841; H01L 21/76871; H01L 21/28562; C23C 16/45553; C23C 16/18
See application file for complete search history.

(56) References Cited

U.S. PATENT DOCUMENTS

| | | | |
|---|---|---|---|
| 4,668,538 A * | 5/1987 | Feichtner .............. C23C 16/30 | 427/248.1 |
| 5,186,718 A | 2/1993 | Tepman et al. | |
| 6,287,965 B1 * | 9/2001 | Kang et al. .................... | 438/648 |
| 6,395,840 B1 * | 5/2002 | Paul et al. .................... | 525/328.6 |
| 7,611,751 B2 * | 11/2009 | Elers ............................ | 427/249.1 |
| 8,236,718 B1 * | 8/2012 | Kepley et al. .................. | 501/92 |
| 2003/0059538 A1 | 3/2003 | Chung et al. | |
| 2004/0053495 A1 * | 3/2004 | Vaartstra et al. ............. | 438/656 |
| 2007/0148350 A1 | 6/2007 | Rahtu et al. | |
| 2008/0136028 A1 * | 6/2008 | Wai et al. ...................... | 257/751 |
| 2009/0121197 A1 * | 5/2009 | Thaler et al. .................. | 252/516 |
| 2010/0048029 A1 | 2/2010 | Kumar et al. | |
| 2010/0068880 A1 * | 3/2010 | Hatanaka et al. ............ | 438/627 |
| 2010/0119315 A1 * | 5/2010 | Kathrein ................. B65B 1/26 | 407/119 |
| 2010/0168404 A1 * | 7/2010 | Girolami et al. ................ | 534/15 |
| 2011/0104907 A1 * | 5/2011 | Lee ......................... C23C 16/401 | 438/778 |
| 2012/0034492 A1 | 2/2012 | Ruffini et al. | |
| 2012/0094483 A1 * | 4/2012 | Komiya .................. C23C 16/06 | 438/653 |
| 2012/0107503 A1 * | 5/2012 | Abelson .............. C23C 16/0272 | 427/255.7 |
| 2012/0164846 A1 | 6/2012 | Ha et al. | |
| 2012/0225548 A1 * | 9/2012 | Kang et al. .................... | 438/597 |
| 2013/0113085 A1 * | 5/2013 | Michaelson et al. .......... | 257/632 |
| 2014/0084387 A1 * | 3/2014 | Dewey et al. ................. | 257/410 |

OTHER PUBLICATIONS

Kumar, Navneet, Wontae Noh, Scott R. Daly, Gregory S. Girolami, and John R. Abelson. "Low Temperature Chemical Vapor Deposition of Hafnium Nitride—Boron Nitride Nanocomposite Films." Chemistry of Materials 21.23 (2009): 5601-606. Web.*

Babar, Kumar, Zhang, and Abelson. "Growth Inhibitor to Homogenize Nucleation and Obtain Smooth. HfB2 Thin Films by Chemical Vapor Deposition." American Chemical Society, n.d. Web.*

Jayaraman, Sreenivas, Yu Yang, Do Young Kim, Gregory S. Girolami, and John R. Abelson. "Hafnium Diboride Thin Films by Chemical Vapor Deposition from a Single Source Precursor." Journal of Vacuum Science & Technology A: Vacuum, Surfaces, and Films 23.6 (2005): 1619. Web.*

Goedde, Dean M. et al., A New Class of CVD Precursors to Metal Borides: $Cr(B_3H_8)_2$ and Related Octahydrotriborate Complexes, *J. Am. Chem. Soc.*, vol. 126 2004, 12230-12231.

Hatanaka, Masanobu et al., ZrBO Dielectrics for TSV Production Process, *ULVAC, Inc. Institute of Semiconductor and Electronics Technologies* 2011, 3 pages.

Jayaraman, Sreenivas et al., Hafnium Diboride Thin Films by Chemical Vapor Deposition form a Single Source Precursor, *J. Vac. Sci. Technol. A 23*(6) Nov./Dec. 2005, 1619-1625.

Kumar, Navneet et al., Low Temperature Chemical Vapor Deposition of Hafnium Nitride—Boron Nitride Nanocomposite Films, *Chem. Mater.*, vol. 21 2009, 5601-5606.

Li, Hai-Wen et al., Recent Progress in Metal Borohydrides for Hydrogen Storage, *Energies*, vol. 4 2011, 185-214.

PCT International Search Report and Written Opinion in PCT/US2014/017101, mailed Jun. 11, 2014, 15 pages.

* cited by examiner

*Primary Examiner* — Jarrett Stark
*Assistant Examiner* — Bitew Dinke
(74) *Attorney, Agent, or Firm* — Servilla Whitney LLC

(57) ABSTRACT

Provided are methods of depositing hafnium or zirconium containing metal alloy films. Certain methods comprise sequentially exposing a substrate surface to alternating flows of an organometallic precursor and a reductant comprising $M(BH_4)_4$ to produce a metal alloy film on the substrate surface, wherein M is selected from hafnium and zirconium, and the organometallic precursor contains a metal N. Gate stacks are described comprising a copper barrier layer comprising boron, a first metal M selected from Hf and Zr, and a second metal N selected from tantalum, tungsten, copper, ruthenium, rhodium, cobalt and nickel; and a copper layer overlying the copper barrier seed layer.

12 Claims, No Drawings

ATOMIC LAYER DEPOSITION OF HAFNIUM OR ZIRCONIUM ALLOY FILMS

CROSS-REFERENCE TO RELATED APPLICATIONS

This application claims the benefit under 35 U.S.C. §119 (e) to U.S. Provisional Application No. 61/766,430, filed Feb. 19, 2013, the entire contents of which are incorporated herein by reference in their entirety.

TECHNICAL FIELD

Embodiments of the present invention generally relate to the deposition of hafnium or zirconium metal alloy films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires a level control of thin film deposition to produce conformal coatings on high aspect ratio structures. One method for deposition of thin films with such control and conformal deposition is atomic layer deposition (ALD). Most ALD processes are based on binary reaction sequences. Each of the two surface reactions occurs sequentially. Because the surface reactions are sequential, the two gas phase reactants are not in contact, and possible gas phase reactions that may form and deposit particles are limited. The typical approach to further ALD development has been to determine whether or not currently available chemistries are suitable for ALD.

One useful application of ALD processes relates the deposition of metal and metal alloy films. One such method of the ALD of a metal alloy involves introducing an organometallic precursor into an ALD system where it partially reacts with the surface of the wafer. Then, a reducing agent like hydrazine in introduced to reduce the partially reacted precursor to a metal. Accordingly, there is a continuing need for new deposition chemistries that are commercially viable.

SUMMARY

One aspect of the invention relates to a gate stack. The gate stack comprises a copper barrier layer comprising boron, a first metal M selected from Hf and Zr, and a second metal N selected from tantalum, tungsten, copper, ruthenium, rhodium, cobalt and nickel; and a copper layer overlying the copper barrier seed layer. In one or more embodiments, the copper barrier layer comprises a film having a formula represented by $M_xB_yN_z$. In some embodiments, the copper barrier layer has a thickness of about 10-20 A. In one or more embodiments, the copper barrier layer overlies a dielectric layer. In some embodiments, the copper barrier seed layer comprises wherein the copper barrier layer comprises a film having a formula represented by MBN.

In one or more embodiments, the copper barrier seed layer comprises substantially no oxygen. In some embodiments, the copper barrier seed layer is deposited by alternate exposures of an organometallic precursor comprising metal N and a reductant comprising $M(BH_4)_4$ to produce a metal alloy film, wherein M is selected from hafnium and zirconium.

Another aspect of the invention relates to a method of depositing a metal alloy film. The method comprises sequentially exposing a substrate surface to alternating flows of an organometallic precursor and a reductant comprising $M(BH_4)_4$ to produce a metal alloy film on the substrate surface, wherein M is selected from hafnium and zirconium, and the organometallic precursor contains a metal N. In one or more embodiments, the metal alloy film comprises M, boron and the metal from the organometallic precursor. In some embodiments, the metal alloy film has a formula represented by $M_xB_yN_z$ or MBN. In one or more embodiments, the organometallic precursor comprises a metal selected from tantalum, tungsten, copper, ruthenium, rhodium, cobalt and nickel. In some embodiments, the metal alloy film comprises M, boron and a metal selected from tantalum, tungsten, copper, ruthenium, rhodium, cobalt and nickel.

In one or more embodiments, the film has a thickness of about 10-20 A. In some embodiments, the substrate surface comprises a dielectric. In one or more embodiments, the substrate surface comprises TaN. In some embodiments, the method further comprises depositing Ru on the film. In one or more embodiments, the method further comprises depositing Cu on the film. In some embodiments, the deposited metal alloy film is a copper seed and barrier layer.

Yet another aspect of the invention pertains to a method of depositing a metal alloy film. The method comprises sequentially exposing a substrate surface to alternating flows of an organometallic precursor and a reductant comprising $Hf(BH_4)_4$ to produce a metal alloy film on the substrate surface, and the organometallic precursor contains a metal N; and subsequently forming a copper layer over the metal alloy film. In one or more embodiments, the film has a thickness of about 10-20 A.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

One or more aspects of the invention provides methods of depositing metal alloy films, which are suitable as barrier/seed/initiation layers. The films are deposited using $Hf(BH_4)_4$ or $Zr(BH_4)_4$ as a reducing agent for an organometallic precursor during an atomic layer deposition process. The resulting films contain Hf or Zr, B and the metal in the organometallic precursor. In one or more embodiments, the deposited films are highly conformal and allow for direct subsequent deposition of other layers, such as Ru or Cu.

Accordingly, one or more aspects of the invention relates to a method of depositing a metal alloy film. The method comprises sequentially exposing a substrate surface to alternating flows of an organometallic precursor and a reductant comprising $M(BH_4)_4$ to produce a metal alloy film on the substrate surface, wherein M is selected from hafnium and zirconium, and the organometallic precursor contains a metal N.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing disclosed may also be performed on an underlayer formed on the substrate as disclosed in more detail below, and the term "substrate surface" is intended to include such underlayer as the context indicates.

In one or more embodiments, the metal alloy films are deposited via an ALD process. As used herein, the phrase "atomic layer deposition" is used interchangeably with "ALD," and refers to a process which involves sequential exposures of chemical reactants, and each reactant is deposited from the other separated in time and space. In ALD, chemical reactions take place only on the surface of the substrate in a stepwise fashion. However, according to one or more embodiments, the phrase "atomic layer deposition" is not necessarily limited to reactions in which each reactant layer deposited is limited to a monolayer (i.e., a layer that is one reactant molecule thick). The precursors in accordance with various embodiments of the invention will deposit conformal films regardless of whether only a single monolayer was deposited. Atomic layer deposition is distinguished from "chemical vapor deposition" or "CVD," in that CVD refers to a process in which one or more reactants continuously form a film on a substrate by reaction in a process chamber containing the substrate or on the surface of the substrate. Such CVD processes tend to be less conformal than ALD processes.

Organometallic Precursor

As used herein, "organometallic precursor" refers to a compound containing a metal bound to one or more organic groups and contain at least one bond between the metal and carbon or nitrogen. In one or more embodiments, the organometallic precursor comprises a metal selected from tantalum, tungsten, copper, ruthenium, rhodium, cobalt and nickel. In one or more embodiments, the organometallic precursor is one that undergoes reductive decomposition to its constituent metal.

The organometallic precursor can be selected depending on the particular application for which the deposited film will be used. In some embodiments, the co-reactant may be chosen to result in a film that has good barrier/seed properties, for example, to enhance the growth of copper films over the film and to prevent copper diffusion to the underlying substrate. For example, in embodiments relating to copper barrier application, the organometallic metal precursor can be chosen to include a metal (e.g., ruthenium or even copper) to better allow for the subsequent deposition of copper over the barrier layer. Examples of suitable copper-containing precursors include, but are not limited to, Cu b-ketoiminate and Cu amidinate, which is oxygen-free. In such embodiments, the method further comprises depositing Cu onto the deposited metal alloy film.

As will be discussed in further detail below, the reducing agent is relatively reactive. Accordingly, in one or more embodiments, the organometallic precursor selected is also relatively reactive, so that the overall deposition process can be carried out at low temperatures.

Reducing Agent

According to various embodiments of the invention, the reducing agent can be represented by the formula $M(BH_4)_4$, where M is a metal. According to specific embodiments, M comprises Hf or Zr, and the precursors therefore have the formula $Hf(BH_4)_4$ (hafnium borohydride) or $Zr(BH_4)_4$ (zirconium borohydride). In one method of synthesizing such $M(BH_4)_4$ precursors, $HfCl_4$ or $ZrCl_4$ is placed in an appropriate vessel (for example, a round bottom flask) and mixed with an excess of $LiBH_4$. A stir bar is added to the flask, and the mixture of two solids is stirred overnight. After stirring is completed, the product, also a white solid, can be optionally purified by sublimation and is transferred to an ampoule appropriate for delivery of the precursor to an ALD reactor.

The $Hf(BH_4)_4$ precursor is relatively volatile and reactive, which allows for the deposition of conformal films at low temperature. Similarly, the closely related and analogous precursor $Zr(BH_4)_4$ may be used to deposit zirconium films using the same organometallic precursors in an analogous ALD process to produce directly analogous films. These borohydrides can react as a good reducing agent towards volatile metal complexes. Additionally, because the hafnium or zirconium borohydride adsorbs very efficiently to surfaces, the nucleation of growth can be very efficient. This allows for the deposition of thin, continuous films. Such thin films are useful for a variety of applications, such as copper barrier and seed layers, as well as for metal gate.

Another aspect of the invention pertains to a method of depositing a metal alloy film, the method comprising: sequentially exposing a substrate surface to alternating flows of an organometallic precursor and a reductant comprising $Hf(BH_4)_4$ to produce a metal alloy film on the substrate surface, and the organometallic precursor contains a metal N; and subsequently forming a copper layer over the metal alloy film.

ALD Process

In exemplary embodiment of an ALD process, a first chemical precursor ("A") is pulsed, for example, an organometallic precursor to the substrate surface in a first half reaction. Excess unused reactants and the reaction by-products are removed, typically by an evacuation-pump down and/or by a flowing inert purge gas. Then a reductant "B", for example $Hf(BH_4)_4$ or $Zr(BH_4)_4$, is delivered to the surface, wherein the previously reacted terminating substituents or ligands of the first half reaction are reacted with new ligands from the "B" co-reactant, creating an exchange by-product. In some embodiments, the "B" reductant also forms self saturating bonds with the underlying reactive species to provide another self-limiting and saturating second half reaction. In alternative embodiments, the "B" reductant does not saturate the underlying reactive species. A second purge period is typically utilized to remove unused reactants and the reaction by-products. The "A" precursor, "B" reductant and purge gases can then again be flowed. The alternating exposure of the surface to reactants "A" and "B" is continued until the desired thickness film is reached, which for most anticipated applications would be approximately in the range of 5 nm to 40 nm, and more specifically in the range of 10 and 30 nm (100 Angstroms to 300 Angstroms). It will be understood that the "A", "B", and purge gases can flow simultaneously, and the substrate and/or gas flow nozzle can oscillate such that the substrate is sequentially exposed to the A, purge, and B gases as desired.

The precursors and/or reactants may be in a state of gas, plasma, vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

Thus, in one or more embodiments, alternating pulses or flows of "A" precursor and "B" reductant can be used to deposit a film, for example, in a pulsed delivery of multiple cycles of pulsed precursors and co-reactants, for example, A pulse, B reductant pulse, A precursor pulse, B reductant pulse, A precursor pulse, B reductant pulse, A precursor pulse, B reductant pulse. As noted above, instead of pulsing the reactants, the gases can flow simultaneously from a gas delivery head or nozzle and the substrate and/or gas delivery head can be moved such that the substrate is sequentially exposed to the gases.

Of course, the aforementioned ALD cycles are merely exemplary of a wide variety of ALD process cycles in which a deposited layer is formed by alternating flows of precursors and reductant.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

As one or more of the ALD processes described herein are low-temperature, it can be particularly advantageous to use these processes with substrates that are thermally unstable. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming hafnium and/or zirconium alloy films, a processing chamber is configured to expose the substrate to a sequence of gases and/or plasmas during the vapor deposition process. The processing chamber would include separate supplies of the A and B reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a ALD process as described herein. Central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

As discussed above, the co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. Plasmas may be useful for depositing, forming, annealing, treating, or other processing of photoresist materials described herein. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a hafnium or zirconium alloy film may be formed during plasma enhanced atomic layer deposition (PEALD) process that provides sequential pulses of a precursors and plasma. In specific embodiments, the co-reactant may involve a plasma. In other embodiments involving the use of plasma, during the plasma exposure, the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated externally from the processing chamber, such as by a remote plasma generator system. During PEALD processes, a plasma may be generated from a microwave (MW) frequency generator or a radio frequency (RF) generator. Although plasmas may be used during the ALD processes disclosed herein, it should be noted that plasmas are not required. Indeed, other embodiments relate to ALD under very mild conditions without a plasma.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of an organometallic precursor, as described above. The apparatus also includes a reactant gas inlet in fluid communication with a supply of a $Hf(BH_4)_4$ or $Zr(BH_4)_4$ reductant as discussed above. The apparatus may further include a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

The ALD process provides that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr.

Also, according to one or more embodiments, the chamber or the substrate may be heated such that deposition can take place at a temperature lower than about 200° C. In other embodiments, deposition may take place at temperatures lower than about 100° C., and in others, even as low as about room temperature. In one embodiment, deposition is carried out at a temperature range of about 50° C. to about 100° C.

A substrate can be any type of substrate described above. Optionally, a substrate may be processed by treating the substrate with a plasma or other suitable surface treatment to provide active sites on the surface of the substrate. Examples of suitable active sites include, but are not limited to O—H, N—H, or S—H terminated surfaces. However it should be noted that this is not required, and deposition according to various embodiments of the invention can be carried out without adding such active sites.

Delivery of "A" Organometallic Precursor to Substrate Surface

The substrate can be exposed to the "A" organometallic precursor gas or vapor formed by passing a carrier gas (for example, nitrogen or argon) through an ampoule of the precursor, which may be in liquid form. The ampoule may be heated. The "A" organometallic precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing "A" precursor gas for a time period within a range from about 0.1 seconds to about 10 seconds, for example, from about 1 second to about 5 seconds, and in a specific example, for approximately 2 seconds. The flow of the "A" precursor gas is stopped once the precursor has adsorbed onto all reactive surface moieties on the substrate surface. In an ideally behaved ALD process, the surface is readily saturated with the reactive precursor "A."

First Purge

The substrate and chamber may be exposed to purging after stopping the flow of the "A" precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge removes any excess precursor, byproducts and other contaminants within the processing chamber. The purge may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

Delivery of "B" Reductant to Substrate Surface

After the first purge, the substrate active sites can be exposed a "B" $Hf(BH_4)_4$ or $Zr(BH_4)_4$ reductant gas or vapor formed by passing a carrier gas (for example, nitrogen or argon) through an ampoule the "B" $Hf(BH_4)_4$ or $Zr(BH_4)_4$ reductant. The ampoule may be heated. The "B" $Hf(BH_4)_4$ or $Zr(BH_4)_4$ reactant gas can be delivered at any suitable flow rate within a range from about 10 sccm to about 2,000 sccm, for example, from about 50 sccm to about 1,000 sccm, and in specific embodiments, at about 200 sccm. The substrate may be exposed to the "B" reductant gas for a time period within a range from about 0.1 seconds to about 8 seconds, for example, from about 1 second to about 5 seconds, and in a specific example, for about 2 seconds. The flow of the "B" $Hf(BH_4)_4$ or $Zr(BH_4)_4$ reductant gas may be stopped once "B" has adsorbed onto and reacted with deposited "A Second Purge The substrate and chamber may be exposed to a purge after stopping the flow of the "B" $Hf(BH_4)_4$ or $Zr(BH_4)_4$ reductant gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge removes any excess precursor, byproducts and other contaminants within the processing chamber. The purge may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. The "B" reductant gas may also be in the form of a plasma generated remotely from the process chamber.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific parts of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The Deposited Films

The deposited metal alloy film comprises the metal M, boron and the metal from the organometallic precursor. In one or more embodiments, the metal alloy film has a formula represented by $M_xB_yN_z$. In embodiments wherein the organometallic precursor comprises a metal selected from tantalum, tungsten, copper, ruthenium, rhodium, cobalt and nickel, the deposited metal alloy film will contain M, boron and tantalum, tungsten, copper, ruthenium, rhodium, cobalt or nickel. That is, for example, where the organometallic precursor contains copper, the deposited metal alloy film will comprise metal M, boron and copper.

In one or more embodiments, the deposited films are advantageously used for copper barrier seed applications. They can be used as alternatives to commonly used films, such as ALD TaN). While not wishing to be bound to any particular theory, the good copper barrier seed are thought to derive both from superior nucleation characteristics of the borohydride precursors over dielectrics, as well as the incorporation of a later transition metal (e.g., Cu or Ru) known to provide a robust EM resistant interface to Cu. In one or more embodiments, the ALD process provides uniform initiation and growth of an amorphous, ultrathin ALD barrier seed layer for Cu metallization.

Accordingly, in one or more embodiments, the substrate surface comprises a dielectric. In some embodiments, the substrate surface comprises TaN.

As one or more of the processes described herein provide thin, continuous films, the barrier seed layers can be advantageously thin. For example, in some embodiments, the film has a thickness of about 10-20 A.

In one or more embodiments, the method further comprises depositing Ru on the film.

Accordingly, one aspect of the invention relates to a gate stack comprising a copper barrier layer comprising boron, a first metal M selected from Hf and Zr, and a second metal N selected from tantalum, tungsten, copper, ruthenium, rhodium, cobalt and nickel; and a copper layer overlying the copper barrier seed layer. In one or more embodiments, the copper barrier layer comprises a metal alloy film deposited via atomic layer deposition.

The above gate stack may be deposited using the aforementioned processes. Thus, in one or more embodiments, the copper barrier seed layer is deposited by alternate exposures of an organometallic precursor comprising metal N and a reductant comprising $M(BH_4)_4$ to produce a metal alloy film, wherein M is selected from hafnium and zirconium. Any of the variants described in the process above apply here as well. Thus, for example, in one or more embodiments, the copper barrier layer comprises a film having a formula represented by MBN or $M_xB_yN_z$. In some embodiments, the copper barrier layer has a thickness of about 10-20 A. In one or more embodiments, the copper barrier layer overlies a dielectric layer. In some embodiments, the copper barrier seed layer comprises. In some embodiments, the copper barrier seed layer comprises substantially no oxygen.

The substrate can also be stationary or rotated during processing. A rotating substrate can be rotated continuously or in discreet parts. For example, a substrate may be rotated throughout the entire process, or the substrate can be rotated by a small amount between exposure to different reactive or purge gases. Rotating the substrate during processing (either continuously or in parts) may help produce a more uniform deposition or etch by minimizing the effect of, for example, local variability in gas flow geometries.

Reference throughout this specification to "one embodiment," "certain embodiments," "one or more embodiments"

or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a metal alloy film, the method comprising sequentially exposing a substrate surface to alternating flows of an organometallic precursor and a reductant comprising $M(BH_4)_4$ to produce a metal alloy film on the substrate surface, wherein M is selected from hafnium and zirconium, and the organometallic precursor contains a metal N selected from tantalum, tungsten, copper, ruthenium, rhodium, cobalt and nickel.

2. The method of claim 1, wherein the metal alloy film comprises M, boron and the metal from the organometallic precursor.

3. The method of claim 2, wherein the metal alloy film has a formula represented by $M_xB_yN_z$.

4. The method of claim 1, wherein the metal alloy film comprises M, boron and a metal selected from tantalum, tungsten, copper, ruthenium, rhodium, cobalt and nickel.

5. The method of claim 1, wherein the film has a thickness of about 10-20 Å.

6. The method of claim 1, wherein the substrate surface comprises a dielectric.

7. The method of claim 1, wherein the substrate surface comprises TaN.

8. The method of claim 1, further comprising depositing Ru on the metal alloy film.

9. The method of claim 1, further comprising depositing Cu on the metal alloy film.

10. The method of claim 9, wherein the deposited metal alloy film is a copper seed and barrier layer.

11. A method of depositing a metal alloy film, the method comprising:
  a. sequentially exposing a substrate surface to alternating flows of an organometallic precursor and a reductant comprising $Hf(BH_4)_4$ to produce a metal alloy film on the substrate surface, and the organometallic precursor contains a metal N; and
  b. subsequently forming a copper layer over the metal alloy film.

12. The method of claim 11, wherein the film has a thickness of about 10-20 Å.

* * * * *